United States Patent [19]

Yamazaki et al.

[11] Patent Number: 5,604,137

[45] Date of Patent: Feb. 18, 1997

[54] METHOD FOR FORMING A MULTILAYER INTEGRATED CIRCUIT

[75] Inventors: Shunpei Yamazaki, Tokyo; Yasuhiko Takemura, Kanagawa; Akira Mase, Aichi; Hideki Uochi, Kanagawa, all of Japan

[73] Assignee: Semiconductor Energy Laboratory Co., Ltd., Kanagawa-ken, Japan

[21] Appl. No.: 460,632

[22] Filed: Jun. 2, 1995

Related U.S. Application Data

[62] Division of Ser. No. 293,427, Aug. 22, 1994, which is a continuation of Ser. No. 948,426, Sep. 22, 1992, abandoned.

[30] Foreign Application Priority Data

Sep. 25, 1991 [JP] Japan ................................. 3-273376

[51] Int. Cl.⁶ ...................... H01L 21/8238; H01L 21/84
[52] U.S. Cl. ................................ 437/40; 437/56; 437/915
[58] Field of Search ........................... 437/21, 40 TF, 437/41 TF, 34, 52, 56, 57, 915

[56] References Cited

U.S. PATENT DOCUMENTS

| | | |
|---|---|---|
| 3,890,632 | 6/1975 | Ham et al. |
| 4,272,880 | 6/1981 | Pashley ................................. 257/354 |
| 4,399,605 | 8/1983 | Dash et al. ........................... 257/351 |
| 4,498,226 | 2/1985 | Inoue et al. ........................... 437/915 |
| 4,654,121 | 3/1987 | Miller et al. .......................... 257/70 |
| 4,754,314 | 6/1988 | Scott et al. ............................ 257/351 |
| 4,902,637 | 2/1990 | Kondou et al. ....................... 437/915 |
| 5,047,356 | 9/1991 | Li et al. ................................ 257/351 |
| 5,128,732 | 7/1992 | Sugahara et al. .................... 257/351 |
| 5,474,942 | 12/1995 | Kodaira et al. ...................... 437/21 |

FOREIGN PATENT DOCUMENTS

| | | |
|---|---|---|
| 301571 | 2/1989 | European Pat. Off. .......... 437/40 TF |
| 63-137450 | 6/1988 | Japan .................................... 437/915 |
| 1-183853 | 6/1989 | Japan . |
| 1-268064 | 10/1989 | Japan .................................... 437/41 TF |
| 2-85826 | 3/1990 | Japan . |
| 2-299235 | 12/1990 | Japan .................................... 437/40 TF |
| 2-307273 | 12/1990 | Japan .................................... 437/40 TF |
| 3-227565 | 10/1991 | Japan . |

OTHER PUBLICATIONS

S. Wolf "Silicon Processing for the VLSI Era", vol. II, pp. 268–273, 568–583 Jun. 1990.

*Primary Examiner*—Charles L. Bowers, Jr.
*Assistant Examiner*—Leon Radomsky
*Attorney, Agent, or Firm*—Sixbey, Friedman, Leedom & Ferguson; Gerald J. Ferguson, Jr.; Bradley D. Blanche

[57] ABSTRACT

A multilayer semiconductor integrated circuit which does not suffer from latchup. The circuit comprises a semiconductor substrate, a first MOS transistor formed on the substrate, an interlayer insulator deposited on the first transistor, and a second MOS transistor formed on the interlayer insulator. The two transistors have different conductivity types. The gate electrode of the second transistor consists mainly of metal or metal silicide, e.g. aluminum. The upper and side surfaces of the gate electrode is coated with a material comprising an oxide of the metal or metal silicide.

11 Claims, 8 Drawing Sheets

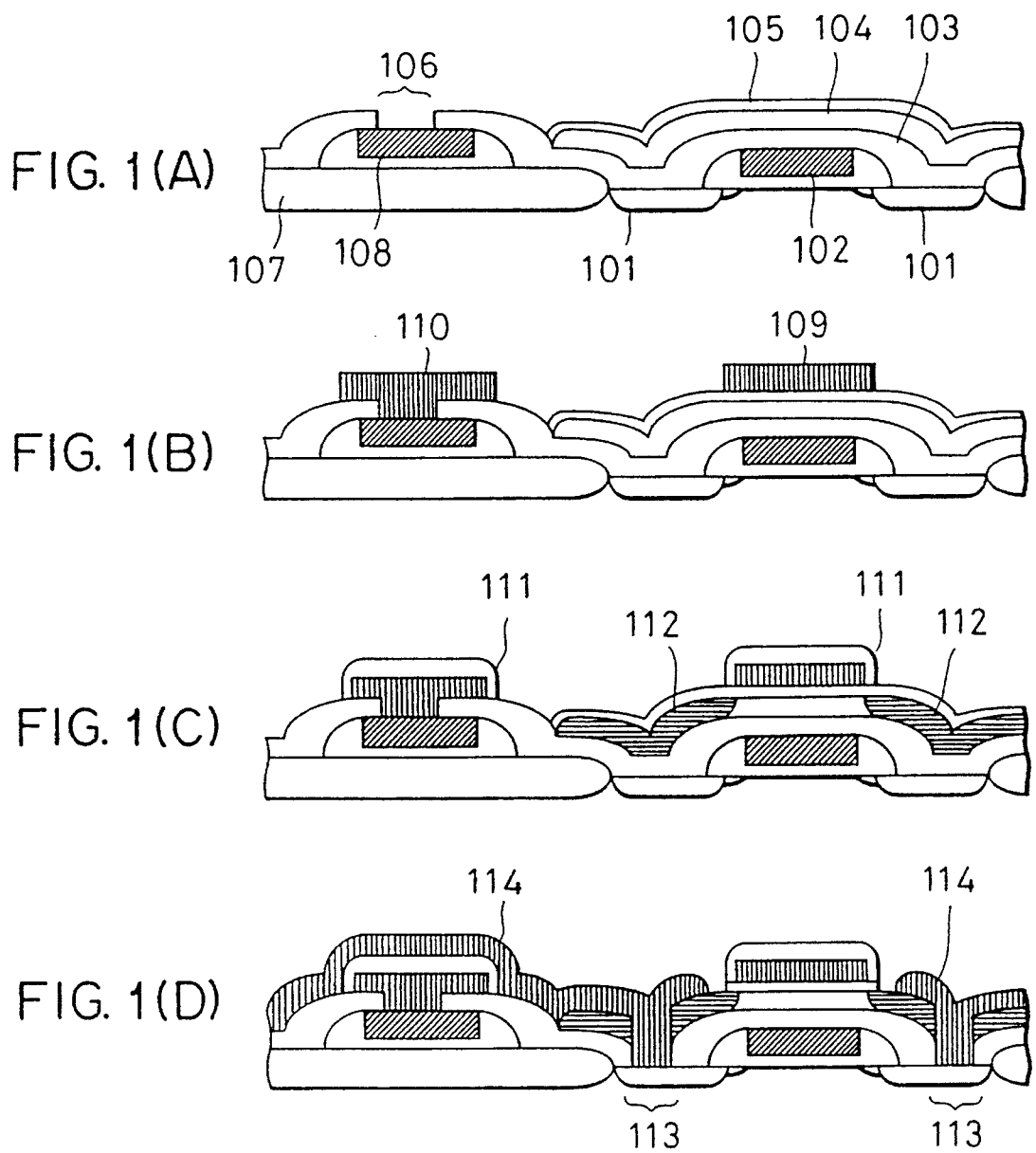

METHOD FOR FORMING A MULTILAYER INTEGRATED CIRCUIT

This is a divisional application of Ser. No. 08/293,427, filed Aug. 22, 1994; which itself is a continuation of application Ser. No. 07/948,426, filed Sep. 22, 1992, now abandoned.

FIELD OF THE INVENTION

The present invention relates to a semiconductor device, particularly a highly reliable semiconductor integrated circuit, which can be easily mass-produced and has a high device density. The present invention also relates to a method for forming such a semiconductor device and an integrated circuit.

BACKGROUND OF THE INVENTION

In recent years, a semiconductor integrated circuit which is designed to have a multilayer structure to pack semiconductor components at a higher density has been developed. In particular, a semiconductor circuit is conventionally formed on a semiconductor substrate of a single crystal. A coating of polycrystalline or substantially single-crystal semiconductor is formed on the semiconductor circuit. Another semiconductor circuit is formed on this coating. A typical example of this is a completely CMOS static RAM (SRAM) having two layers of MOS transistors. That is, MOS transistors are formed on a substrate of a single crystal. Thin-film transistors are formed over the MOS transistors. The conventional completely CMOS SRAM needs two pairs of CMOS transistors (i.e., two NMOS transistors and two PMOS transistors) and two driver NMOS transistors per storage cell. Hence, a large area is required. Therefore, these SRAM devices were supplanted by high-resistivity SRAM devices which use high-resistivity polysilicon instead of PMOS devices. The high-resistivity polysilicon forms plural layers as viewed from the transistors to increase the device density. However, where the device density increases greatly, the leakage current is too large when linear resistive devices are used as loads. For this reason, the conventional completely CMOS devices in which PMOS devices are used as loads have begun to be employed again, the PMOS devices being linear devices. However, the device density makes it impossible to adopt the prior art planar structure. At present, therefore, PMOS transistors are formed as thin-film transistors so as to create a multilayer structure.

This multilayer structure yields various advantages as well as the increased device density. In particular, one further advantage is that it is easy to separate devices. Especially, latchup which presents problems in the case of conventional CMOS monolithic integrated circuits does not take place. More specifically, in the multilayer structure described above, PMOS devices are completely separated from the substrate and from NMOS devices and so there is no possibility of the occurrence of parasitic transistors via NMOS devices adjacent to the substrate. Consequently, there is no probability that latchup occurs.

For these reasons, multilayer integrated circuits which are also known as three-dimensional ICs have been manufactured. However, the conventional multilayer ICs are fabricated by the same manufacturing steps as used to form conventional integrated circuits on a semiconductor substrate. Therefore, many masks are needed for the fabrication. For example, in order to built a CMOS inverter circuit from a multilayer integrated circuit having three layers of polysilicon and one layer of aluminum metallization interconnections, the following steps are necessitated after the first layer of MOS transistors having polysilicon gates using the first polysilicon layer is formed:

(1) Formation of a first interlayer insulator.
(2) Formation and etching of a second polysilicon layer. This step needs a first mask.
(3) Formation of a gate-insulating film.
(4) Formation of holes in the interlayer insulator for connection with the gate interconnects of the first MOS transistors. This step needs a second mask.
(5) Formation of the gate electrodes (a third layer of polysilicon) of second transistors. This step needs a third mask.
(6) Implantation of dopant ions.
(7) Formation of a second interlayer insulator.
(8) Formation of holes in the second interlayer insulator to have access to source and drain electrodes. This step needs a fourth mask.
(9) Formation of holes in the first interlayer insulator to have access to the source and drain electrodes. This step needs a fifth mask.
(10) Formation of source and drain electrode interconnects. This step needs a sixth mask.
(11) Formation of a passivation film.

In this way, at least 6 masks are necessary. To increase the value of the integrated circuit, more masks are needed. Especially, in the steps (7) and (8) described above, if a CMOS inverter is fabricated, conductive interconnects connected with grounded portions must be formed independent of conductive interconnects for supplying drain voltages and, therefore, the use of a mask is unavoidable. In a CMOS transfer gate circuit, the doped regions of the NMOS and PMOS transistors are coupled. In this case, therefore, the doped region of the NMOS transistor overlaps the doped region of the PMOS transistor. Therefore, one might consider that it is not necessary to carry out two separate steps only if these two doped regions of the NMOS and PMOS transistors are connected with each other. Indeed, one would reasonably consider that if holes extending through the sources or drains of the NMOS or PMOS transistors are formed by the use of one mask, then contact to both MOS transistors can be made.

Researches made recently have revealed that decreasing the thickness of the doped region of a PMOS transistor improves the characteristics. Usually, the thickness is set less than 100 nm. Sometimes, doped regions as thin as 20 nm are utilized. Therefore, if only a hole extending through both doped regions is formed, the contact made is far from satisfaction. Typically, the radius of the hole is 2 μm, and the thickness of the doped regions of the PMOS transistors is 100 nm. In this case, the total area of the electrodes formed in the NMOS transistor is about 12.6 μm$^2$, while the total area of the electrodes formed on the doped regions of the PMOS transistors is only one tenth of that area, i.e., 1.3 μm$^2$. This electrode area is too small, though the electric power consumed by the CMOS transistor is small. This small area cannot withstand normal operation.

Accordingly, a hole is formed in the second interlayer insulator, although this step is cumbersome to perform. Also, holes are formed to permit formation of electrodes connected with the doped region of the PMOS transistor. Then, holes extending through the second and first interlayer insulators are formed to permit formation of electrodes connected to the doped region of the NMOS transistor. The areas of the two kinds of electrode portions are made substantially equal.

Where the thickness of the doped region of the PMOS transistor is quite thin, e.g., less than 50 nm, sufficient care must be taken in forming a hole in the second interlayer insulator. Generally, the thickness of an interlayer insulator is made larger than 200 nm, taking account of the insulating characteristics of the insulator and the parasitic capacitance between the overlying and underlying conductive interconnection layers. In practice, the previously formed gate oxide film remains. This gate oxide film is 50 to 200 nm thick for thin-film transistors. Therefore, an oxide 250–400 nm or more thick exists on the doped region in practice. Plasma etching is exploited for the formation of such a hole in the interlayer insulator. Although the ratio of the etch selectivity for silicon to the etch selectivity for silicon oxide is sufficiently large, the hole may erroneously extend into the silicon film unless the plasma etching process is carried out accurately. It is relatively easy to form holes in flat portions, but it is difficult to form holes in curved surfaces. Since the thickness of the interlayer insulator varies from location to location, it is quite difficult to terminate the etching at the surface of the silicon film over the whole length of the hole.

Obviously, a reduction in the number of masking steps is essential to increase in the production yield in manufacturing semiconductor integrated circuits and to reduce the cost.

SUMMARY OF THE INVENTION

It is an object of the present invention to provide a method for forming a semiconductor device or a semiconductor integrated circuit with a reduced number of masks and with improved production yield.

It is another object of the invention to provide a semiconductor device or a semiconductor integrated circuit in which each layer of conductive interconnections are coated with an insulating layer which is excellent in voltage-resistance, to thereby prevent short circuit to the overlying layer of conductive interconnections.

In accordance with the present invention, the silicon gate electrodes of the upper layer of thin-film transistors used conventionally are replaced by aluminum gate electrodes. These thin-film transistors are also referred to as the second MOS transistors. In the description made above, these thin-film transistors are PMOS devices, but they can also be NMOS devices. The surfaces of the aluminum gate electrodes are oxidized by anodic oxidation to form an oxide layer withstanding high voltages. This oxide layer is used instead of an interlayer insulator. This can reduce the number of masks used. Furthermore, the voltage-resistance between adjacent layers of conductive interconnections is improved. More specifically, where a CMOS inverter circuit configuration similar to the inverter circuit described previously is fabricated in accordance with the present invention, the following steps are needed after NMOS transistors are fabricated. In this example, however, two layers of polysilicon and two layers of aluminum interconnections are formed, since the gate electrodes of the PMOS transistors are made of aluminum.

(1a) Formation of an interlayer insulator.

(2a) Formation and etching of a second polysilicon layer. This step needs a first mask.

(3a) Formation of a gate-insulating film.

(4a) Formation of holes in the interlayer insulator for connection with the gate interconnects of the first MOS transistors. This step needs a second mask.

(5a) Formation of the gate electrodes (a first aluminum layer) of second transistors. This step needs a third mask.

(6a) Anodic oxidation of the surfaces of the gate electrodes and of the gate interconnects.

(7a) Implantation of dopant ions.

(8a) Removal of the gate-insulating film and exposing of the doped regions of the PMOS transistors.

(9a) Formation of holes in the interlayer insulator to have access to the source and drain electrodes. This step needs a fourth mask.

(10a) Formation of source and drain electrodes and interconnects, using the second aluminum layer. This step needs a fifth mask.

(11a) Formation of a passivation film.

In this manner, the number of manufacturing steps remains the same but the number of the masks used can be reduced by one. It is to be noted that the omitted masking step is most difficult to perform as described already. Therefore, the production yield can be enhanced greatly by the omission of this step. Instead of the step (8) of the conventional process, step (8a) is effected in the novel method. In this step, hydrofluoric acid which attacks neither silicon nor aluminum oxide but dissolves silicon oxide is used as an etchant. In this step, the interlayer insulator previously formed is partially etched away. However, if the interlayer insulator is thicker than the gate oxide film, it is unlikely in this step that the interlayer insulator is corroded to such an extent that the underlying semiconductor substrate and the polysilicon layer are exposed.

To assure that the first polysilicon layer on which the gate interconnects and electrodes for the first MOS transistors are formed are prevented from being exposed, conductive interconnects are formed out of the first aluminum layer over the first polysilicon interconnects and electrodes. Gate interconnects and electrodes for the second MOS transistors are formed on the first aluminum layer. Since the aluminum interconnects have been anodized, the surface has been changed to insoluble aluminum oxide. The material under this aluminum oxide is not easily attacked.

Where a CMOS transfer gate circuit is fabricated, using two layers of polysilicon and two layers of aluminum interconnects, the following steps are required after NMOS transistors are fabricated on a semiconductor substrate.

(1b) Formation of an interlayer insulator.

(2b) Formation and etching of a second polysilicon layer. This step needs a first mask.

(3b) Formation of a gate-insulating film.

(4b) Formation of the gate electrodes of second transistors (a first aluminum layer). This step needs a second mask.

(5b) Anodic oxidation of the surfaces of the gate electrodes and of the gate interconnects.

(6b) Implantation of dopant ions.

(7b) Removal of the gate-insulating film and exposing of the doped regions of the PMOS transistors.

(8b) Formation of holes in the interlayer insulator to have access to the source and drain electrodes. This step needs a third mask.

(9b) Formation of source and drain electrodes and interconnects, using the second aluminum layer. This step needs a fourth mask.

(10b) Formation of a passivation film.

That is, the step (4a) needed in the process for fabricating the CMOS inverter is dispensed with. In the CMOS transfer gate circuit, it is not necessary to connect the gates of the NMOS transistors with the gates of the PMOS transistors and, therefore, this step is unnecessary. Eventually, the circuit is completed with four masks. This principle also applies where the prior art method is used. The conventional multilayer integrated circuit can be manufactured with five masks, which are fewer by one than the masks used to fabricate an inverter.

In accordance with the present invention, a more reliable circuit can be built with the same number of masks as used in the prior art techniques. The same inverter is fabricated by the same method by carrying out the following steps.

(1c) Formation of a first interlayer insulator.

(2c) Formation and etching of a second polysilicon layer. This step needs a first mask.

(3c) Formation of a gate-insulating film.

(4c) Formation of holes in the interlayer insulator which are used for connection with the gate interconnects for first MOS transistors. This step needs a second mask.

(5c) Formation of the gate electrodes of second transistors (a first aluminum layer). This step needs a third mask.

(6c) Anodic oxidation of the surfaces of the gate electrodes and of the gate interconnects.

(7c) Implantation of dopant ions.

(8c) Formation of a second interlayer insulator.

(9c) Formation of holes in the second interlayer insulator to have access to the source and drain electrodes. This step needs a fourth mask.

(10c) Formation of holes in the second interlayer insulator to have access to the source and drain electrodes. This step needs a fifth mask.

(11c) Formation of source and drain electrodes and interconnects, using the second aluminum layer. This step needs a sixth mask.

(12c) Formation of a passivation film.

In this way, the number of the steps is increased. The number of masking steps is the same as used in the prior art techniques. In the circuit fabricated in this manner, the surfaces of the gate electrodes and of the gate interconnects of the second transistors are coated with the anodic oxidized film and with the interlayer insulator. Especially, the anodic oxidized film is dense and withstands high voltages. Therefore, it is effective in preventing short circuit when a high voltage is inadvertently applied between conductive interconnections.

The silicon oxide which has been heretofore used as an interlayer insulator is unable to fully cover undulations of conductive interconnections. The silicon oxide layer varies in thickness from location to location. Especially, the oxide layer is thinner on the side surfaces of the gate interconnects which are the lower conductive interconnects. On the other hand, a sufficiently thick film is formed on the upper surfaces of the lower conductive interconnects. In the subsequent thermal treatment, the nonuniformity of the thickness leads to peeling of the interlayer insulator. Under this condition, if the upper conductive interconnects are formed, short circuit tends to occur on the side surfaces of the lower conductive interconnects. In accordance with the present invention, however, an anodic oxidized insulating film which is uniform in thickness, including the side surfaces and top surfaces of the lower conductive interconnects, can be formed. Hence, the above-described problem is solved.

In the present invention, if the gate electrodes of the second MOS transistors are made of aluminum containing little impurities or of pure aluminum, then a sufficient rigidity is not obtained. Where the gate electrodes are vulnerable to mechanical force as encountered when electromigration occurs, a coating is formed out of an alloy of aluminum to which 1–10% silicon is added. Instead of aluminum, titanium , tantalum, aluminum silicide, titanium silicide, or tantalum silicide may be used. Films of oxides of these metals can be formed by anodic oxidation. Also, this kind of oxide film is excellent in voltage-resistance. However, it must be noted in selecting the metal that titanium oxide and tantalum oxide have much higher dielectric constants than that of aluminum oxide. Therefore, if an insulating interlayer is made of a material of such a high dielectric constant, then a large dielectric loss may be produced. Furthermore, it must be noted in selecting the material that tantalum and titanium have higher resistivities than that of aluminum. Since titanium and tantalum are excellent in heat resistance, these materials can be used where high temperatures occur in the subsequent manufacturing process.

Where second transistors are PMOS transistors, if aluminum is employed, almost no channel is formed in OFF condition because of the relation among the work function of aluminum, the work function of silicon, and the energy levels. That is, the leakage current is small. Consequently, quite highly reliable MOS transistors can be manufactured.

Where titanium or tantalum is used instead of aluminum, the intimateness of the used material with the underlying oxide film must also be taken into account. Generally, the intimateness of these materials with silicon oxide is poor. Therefore, discontinuity of the intimateness must be eliminated by making the gate-insulating film multilayer. However, this is undesirable, because the manufacturing process is complicated.

A solution method and a plasma method are available as anodic oxidation methods. In the solution method, the whole substrate is immersed in an electrolytic solution. Then, the gate interconnects are connected with a power supply to supply direct current or alternating current, for anodic oxidizing the gate interconnects and gate electrodes. As a result, oxide films are formed on their surfaces. Where the gate interconnects are made of aluminum, a coating of aluminum oxide is formed. Where the gate interconnects are made of titanium, a coating of titanium oxide is formed. Where the gate interconnects are made of tantalum, a coating of tantalum oxide is formed. These oxide films are not pure compounds of metals and oxygen. Rather, an element constituting an electrolyte may be contained in such a metal oxide coating, or a hydrate may be formed. Therefore, their physical properties are not constant. For example, where an organic acid is used as the electrolyte, carbon is contained in the oxide film. Where sulfuric acid is used as the electrolyte, sulfur is contained in the oxide film. Materials containing alkali metal ions should not be used as the electrolyte, because if ions of alkali metals such as sodium and potassium enter a semiconductor region, the conducting characteristics of the semiconductor are impaired greatly.

As an example, where only certain gate interconnects are connected with the power supply but the others are not, an oxide film is formed only on the gate interconnects connected with the power supply; substantially no oxide film is formed on the other gate interconnects except for natural oxide film. Alternatively, the energization time, the current, the voltage, or other factor may be varied between these conductive interconnects. In this way, it is possible to vary the thickness of the formed oxide film. For instance, where it is used as an interlayer insulator, it is desired to increase the film thickness in order to reduce the capacitance between conductive interconnects. On the other hand, where the oxide film is employed as an insulator for a capacitor, it is desired to reduce the thickness. Where the purpose differs in this way, the use of the above-described procedure is effective.

When the conductive interconnects are coated with an oxide film as described above, the substrate is taken out of the solution and dried well. If necessary, the substrate is exposed to hot water or vapor to modify the quality of the oxide film. In particular, when a thick oxide film should be obtained, the film obtained by anodic oxidation is porous. This film may not be satisfactorily resistant to voltages, though the film is thick. Also, in the subsequent steps, an electrical short circuit may occur via holes. In this case, the oxide film is reacted with hot water to form a hydrate, thus increasing the volume. In this way, the holes are plugged up, and a dense and highly insulative film is derived. In any case, the coating is required to be cleaned sufficiently so that no electrolyte is left on the coating, and then it is dried. The resulting laminate is shown in FIG. 1(C).

Normal anodic oxidation process is carried out in an acid solution. The anodic oxidation process can also be effected in a plasma. The method using a solution is economical and can process a large number of devices at a time. However, moving ions such as sodium can easily enter. The presence of these ions is fatal to submicron and quarter-micron devices. On the other hand, anodic plasma oxidation is a much cleaner method than the method using a solution. However, the anodic plasma oxidation is not suited for mass-production and cannot easily produce thick oxide films.

The thickness of each anodic oxidized film must be determined according to the purpose. Usually, the anodic oxidized film is expected to function as an interlayer insulator. Therefore, the thickness is between 0.1 and 0.6 μm, preferably between 0.2 and 0.5 μm.

The present invention offers further advantages. For example, in a normal multilayer integrated circuit, thin-film transistors are quite rarely designed to have lightly doped drain regions. One reason for this is that the process is complicated. Another reason is that uniform side walls cannot be obtained by the prior art method. In particular, where a lightly doped drain region is formed by the prior art method, side walls are important in determining the width of the lightly doped drain region. These side walls are obtained by leaving an insulating thick film on the side surfaces of gate electrodes by directional etching. Multilayer integrated circuits are very uneven at locations where thin-film transistors exist. Consequently, it has been impossible to obtain side walls of uniform size at every location with high reproducibility.

Accordingly, most of the prior art thin-film transistors have assumed the typical MOS transistor structure as shown in FIG. 8. This structure is fabricated in the manner described now. First, a gate-insulating film 801 is formed on the surface of a semiconductor region in the form of a thin film. A gate electrode 802 is formed on the film 801. Using this gate electrode as a mask, a doped region 803 is formed by self-aligned ion implantation. Then, an interlayer insulator 804 is deposited. In this thin-film transistor fabricated in this way, it is inevitable that impurities intrude under the gate electrode due to secondary scattering of ions during the ion implantation, as shown in FIG. 8(B). Thus, the gate electrode and the doped region overlap each other over a length L. The overlap results in parasitic capacitance, thus slowing down the operation of the MOS transistor. This problem is solved by the present invention.

Other objects and features of the invention will appear in the course of the description thereof which follows.

BRIEF DESCRIPTION OF THE DRAWINGS

FIG. 1, (A)–(D), are cross-sectional views of a multilayer integrated circuit according to the invention, for illustrating successive steps performed to fabricate the circuit;

DETAILED DESCRIPTION OF THE INVENTION

Figure 3A:
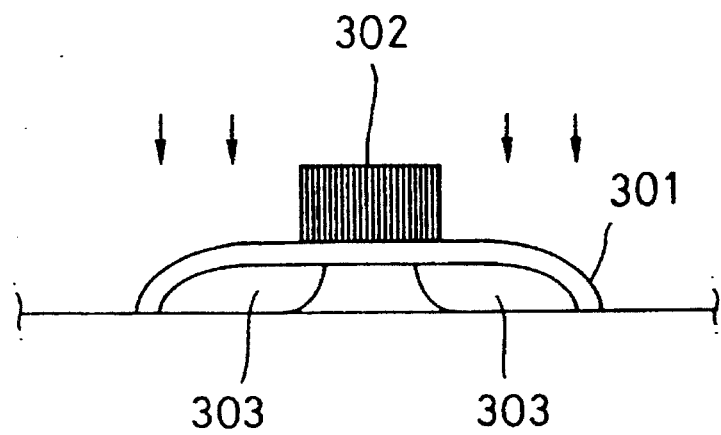
FIG. 3, (A) and (B), are cross-sectional views of a thin-film transistor according to the invention, for illustrating successive steps performed to fabricate the transistor.
Figure 3B:
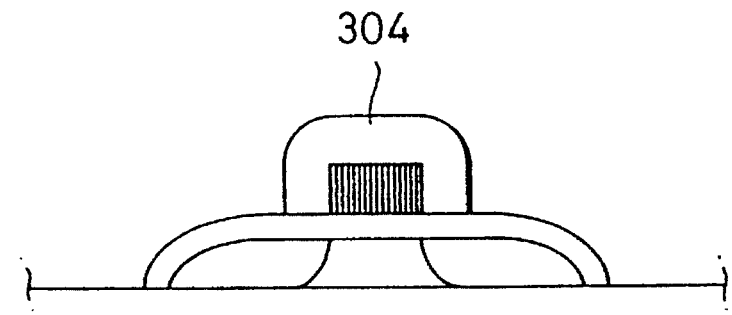

A method of fabricating a thin-film transistor in accordance with the present invention is next described by referring to FIG. 3, (A) and (B). As shown in FIG. 3(A), a gate-insulating film 301 is formed on a semiconductor region taking the form of a thin film. A gate electrode 302 is formed on the gate-insulating film 301. Then, a doped region 303 is formed by self-aligned ion implantation. Usually, the doped region 303 extends under the gate electrode. Up to this step the process is the same as the prior art process, but the following steps are novel. The surface of the gate electrode is anodic oxidized to form an oxide film 304 as shown in FIG. 3(B). This anodic oxidation causes the surface of the gate electrode to retreat. Because of the secondary scattering of ions due to ion implantation and because of the retreat of the gate electrode surface, the doped region and the gate electrode hardly overlap each other, as shown in FIG. 3. Since the extent of the secondary scattering of ions and the degree of anodic oxidation can be considerably accurately calculated by simulation or making use of experience, a structure almost free from overlap can be realized. Also, an overlap over an arbitrary width can be attained. Furthermore, the doped region and the gate electrode can be horizontally spaced a desired distance from each other.

Figure 4A:
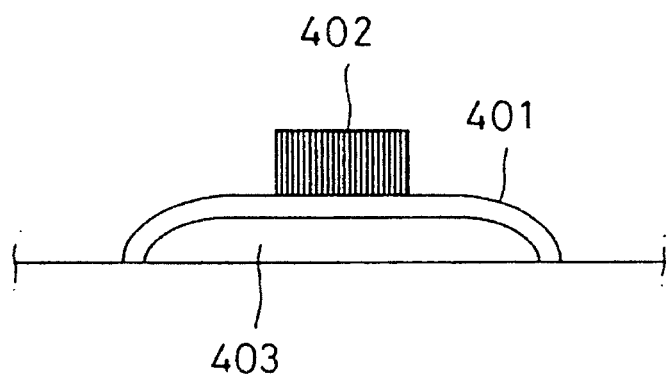
FIG. 4, (A)–(C), are cross-sectional views of another thin-film transistor according to the invention, for illustrating successive steps performed to fabricate the transistor.
Figure 4B:
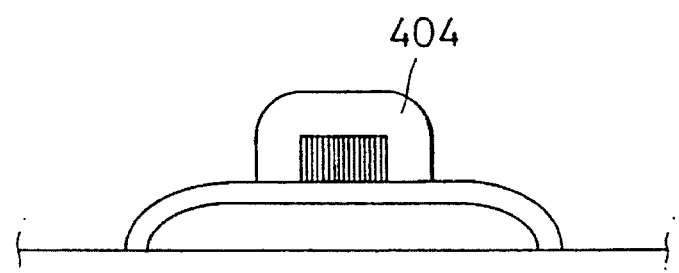
Figure 4C:
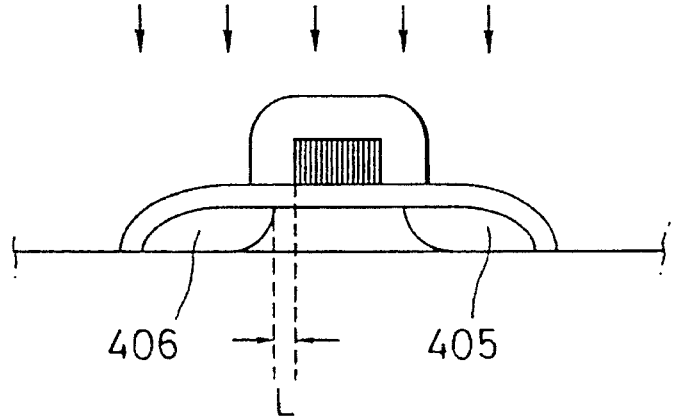

Another method according to the invention is next described by referring to FIG. 4, (A)–(C). First, as shown in FIG. 4(A), a gate-insulating film 401 is formed on a thin-film semiconductor region 403. A gate electrode 402 is formed on the insulating film 401. Then, as shown in FIG. 4(B), an oxide 404 is formed around the gate electrode by anodic oxidation. As shown in FIG. 4(C), ions are implanted to form a doped region 405. Under this condition, the doped region and the gate electrode do not overlap each other. Rather, they are spaced from each other. This state is herein referred to as the offset condition. In the case of a thin-film transistor, leakage current flowing via grain boundaries may pose problems. In the offset condition, this leakage current can be reduced greatly. When a reverse voltage is applied to the gate electrode of a thin-film transistor, a reverse leakage current is often observed. We have discovered that this reverse leakage current can be suppressed. The appropriate length L of the offset region ranges from 0.2 to 0.5 μm. The energy of the implanted ions and the thickness of the anodic oxidized film are determined so as to satisfy these conditions. The length L of the offset region can be set to any desired value by modifying these parameters.

Figure 5A:
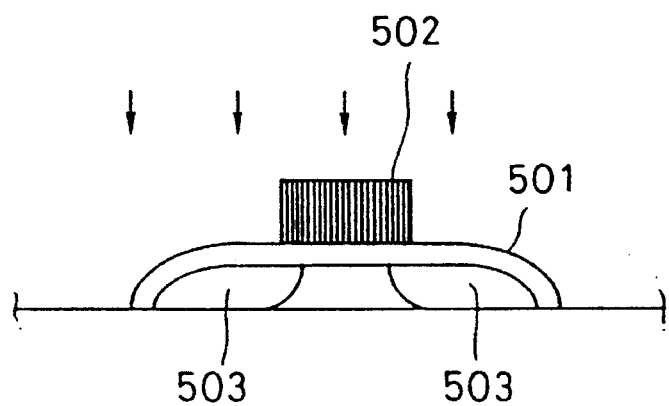
FIG. 5, (A)–(C), are cross-sectional views of a further thin-film transistor according to the invention, for illustrating successive steps performed to fabricate the transistor.
Figure 5B:
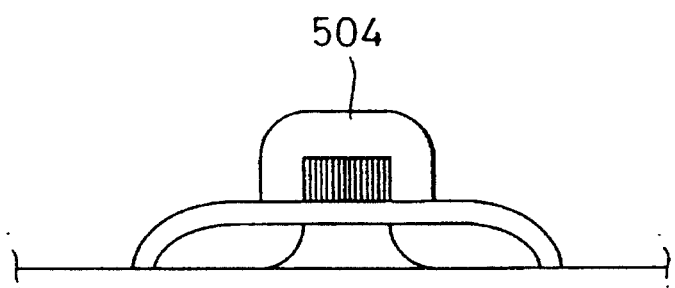
Figure 5C:
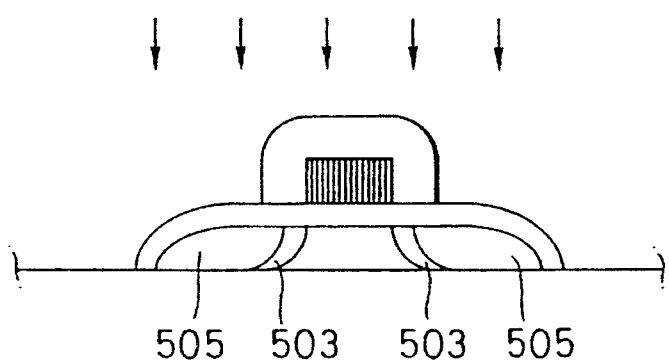

A method of forming a lightly doped drain region in accordance with the present invention is next described by referring to FIG. 5, (A)–(C). First, a doped region 503 is formed as shown in FIG. 5(A). The dopant density in this doped region is $1 \times 10^{17}$ to $5 \times 10^{18}$ atoms/cm$^3$, preferably $5 \times 10^{17}$ to $2 \times 10^{18}$ atoms/cm$^3$. Then, as shown in FIG. 5(B), the gate electrode is anodic oxidized to form an oxide 504. Finally, as shown in FIG. 5(C), ions are again implanted to form a doped region. The dopant density in this doped region is $1 \times 10^{19}$ to $5 \times 10^{22}$ atoms/cm$^3$, preferably $5 \times 10^{20}$ to $2 \times 10^{21}$ atoms/cm$^3$. As a result, a lightly doped region 503 and a heavily doped region 505 are formed. The thickness of the oxide forming side walls is substantially constant irrespective of the inclination of the semiconductor region, since anodic oxidation is adopted. The lightly doped drain region is formed with quite high reproducibility.

Figure 6A:
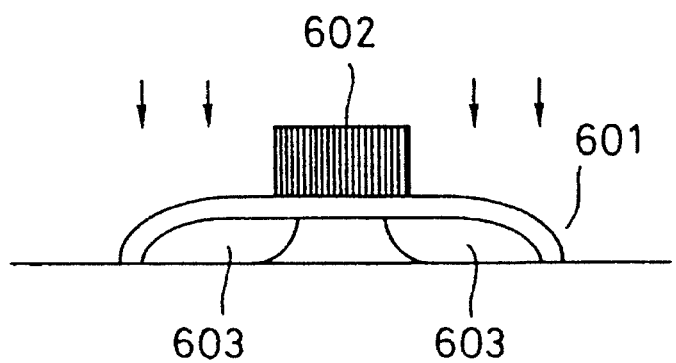
FIG. 6, (A)–(C), are cross-sectional views of a yet other thin-film transistor according to the invention, for illustrating successive steps performed to fabricate the transistor.
Figure 6B:
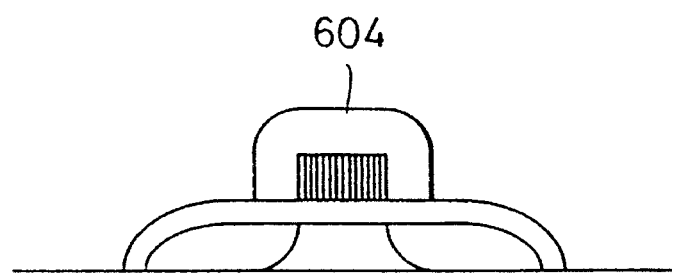
Figure 6C:
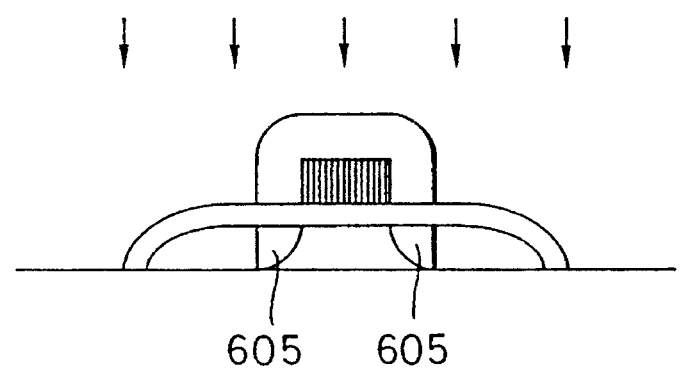

The present invention utilizing laser annealing is next described by referring to FIG. 6, (A)–(C). First, as shown in FIG. 6(A), a doped region 603 is formed by the conventional method. The gate electrode is anodic oxidized to form an oxide 604. At this time, the ion implantation causes the doped region to assume an amorphous or microcrystalline condition. Then, as shown in FIG. 6(C), laser radiation or equivalent intense electromagnetic waves are illuminated from above the laminate to recrystallize the amorphous region or the microcrystalline region. At this time, the gate electrode and the surrounding oxide block the laser radiation and, therefore, the portion existing under the oxide 604 cannot be recrystallized. That is, an n-type (p-type) region— amorphous n-type (p-type) region—I-type channel formation region—amorphous n-type (p-type) region—n-type (p-type) region structure is obtained. We have confirmed that this structure produces the same effects as when a lightly doped drain region is formed. This is described in detail in a Japanese Patent Application filed on Aug. 26, 1991 by the Semiconductor Energy Laboratory Co., Ltd. for "Insulated-Gate Semiconductor Device and Method of Fabricating Same." Therefore, this structure is not described in detail herein.

Figure 7A:
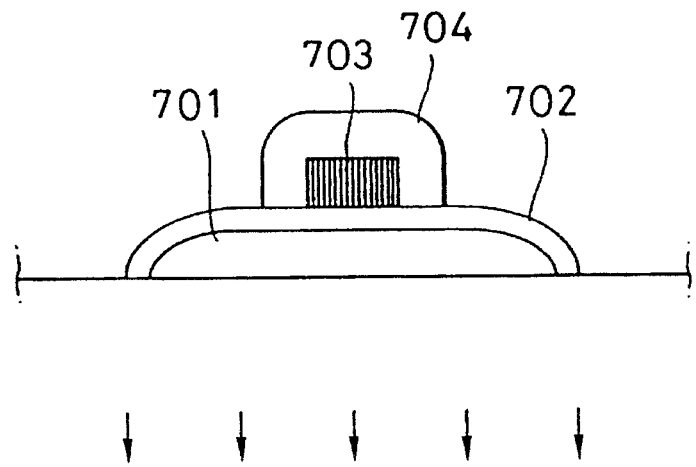
FIG. 7, (A)–(C), are cross-sectional views of a still other thin-film transistor according to the invention, for illustrating successive steps performed to fabricate the transistor.
Figure 7B:
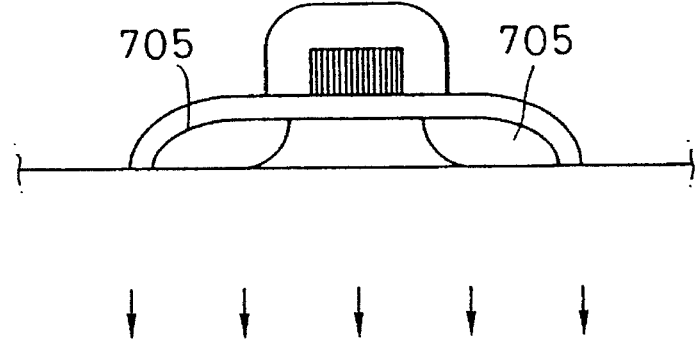
Figure 7C:
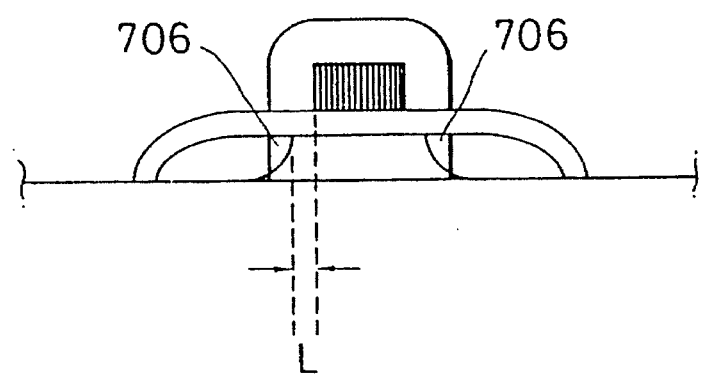
Figure 8A:
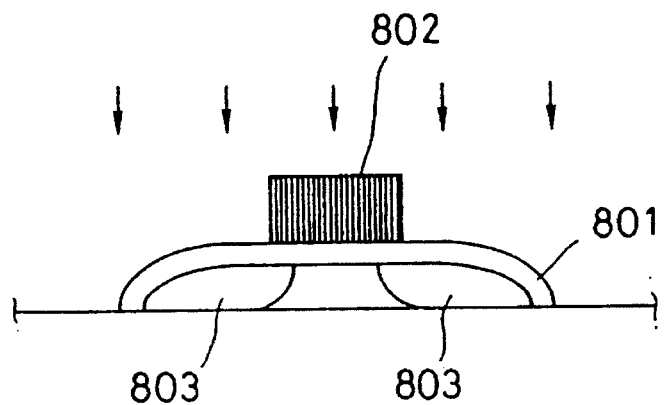
FIG. 8, (A) and (B), are cross-sectional views of a thin-film transistor, for illustrating the prior art method by which the transistor is fabricated.
Figure 8B:
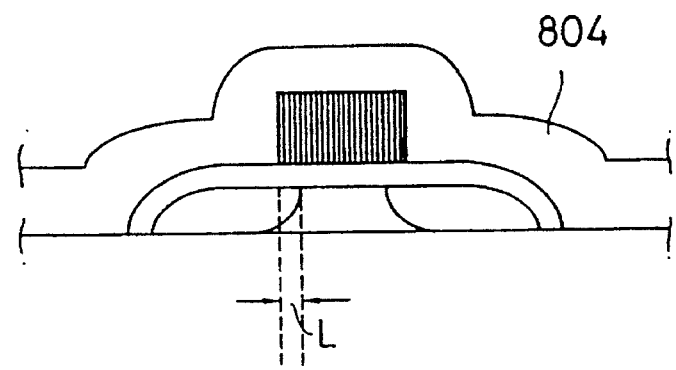

FIG. 7, (A)–(C), show a structure in which an offset region formed by the present invention is combined with the previously described amorphous region. As shown in FIG. 7(A), a gate-insulating film 702 is formed on a semiconductor region 701. Then, a gate electrode 703 is formed on the gate-insulating film 702. The gate electrode is anodic oxidized to form an oxide 704. Then, as shown in FIG. 7(B), a doped region 705 is formed by ion implantation. Finally, the laminate is laser-annealed, in the same way as in the process illustrated in FIG. 6, (A)–(C). Thus, an n-type (p-type) region—amorphous n-type (p-type) region—I-type offset region—I-type channel formation region—I-type offset region—amorphous n-type (p-type) region—n-type (p-type) region structure is obtained. The thin-film transistor of this structure combines features of the structure shown in FIGS. 4, (A)–(C) with the features of the structure shown in FIG. 6, (A)–(C).

In this way, various structures of thin-film transistors can be fabricated in accordance with the present invention. Almost no special techniques or complex steps are needed in manufacturing these various thin-film transistors. It is to be noted that the gist of the present invention is the anodic oxidation of the gate electrode and that methods of fabricating these thin-film transistors are all based on anodic oxidation techniques.

EXAMPLE 1

Example 1 is illustrated in FIG. 1, (A)–(D). Referring to FIG. 1(A), a first MOS transistor of one conductivity type has been formed on a wafer of a single crystal of silicon. In particular, n-type doped regions 101 having lightly doped drain regions are formed on those portions of the surface of the single crystal of silicon which are exposed between LOCOS isolation regions 107. A gate electrode 102 having side walls is formed over the n-type doped region 101. Gate interconnects 108 run from this gate electrode over the device isolation regions 107. An interlayer insulator 103 enclosing these electrode and interconnects is formed on the first MOS transistor. A polysilicon semiconductor film 104 is formed at selected locations on said interlayer insulator to form a second MOS transistor of a conductivity type different from the conductivity type of the first MOS transistor on the interlayer insulator. A gate oxide film 105 is formed on the polysilicon film 104 by oxidizing a surface of the polysilicon film 104 by thermal oxidation. The interlayer insulator 103 overlying the gate interconnects 108 is provided with an opening 106 for connection with the gate interconnects.

Then, as shown in FIG. 1(B), a part 109 to be a gate electrode of the second transistor is formed from metal or metal silicide, e.g. aluminum. Also, gate interconnects 110 connected with the gate electrode 109 are formed from aluminum. These gate electrode and gate interconnects overlap the gate electrode and interconnects of the first transistor. The gate interconnects 108 of the first transistor are connected with the gate interconnects 110 of the second transistor through the hole 106.

A surface of the part 109 to be a gate electrode of the second transistor is anodic oxidized by the procedure described below. A side and an upper surface of the gate electrode of the second transistor is covered with a material comprising an oxide of the metal or metal silicide preferably at a thickness of 200 Å to 3500 Å. It is to be noted that numerical values used in the following description merely constitute examples and that the best values are determined according to the size of the fabricated device or other factor. That is, the numerical values given below never restrict the scope of the invention. First, ethylene glycol solution of tartaric acid having a sufficiently small alkali ion concentration was prepared. The concentration of the tartaric acid was 0.1 to 10%, e.g., 3%. Then, 1–20% (e.g., 10%) aqueous ammonia was added to the tartaric acid so that the pH became 7±0.5.

A platinum electrode was prepared as a cathode. This electrode was immersed in the solution together with the silicon wafer. The gate electrode and interconnects were connected with the positive terminal of a DC power supply. At first, the current was maintained at 2 mA. The voltage between the anode and the cathode, i.e., the platinum electrode, varied with time and with the concentration of the solution and was affected by the thickness of the oxide film formed on the gate electrode and interconnects. Generally, a higher voltage is required as the thickness of the oxide film increases. In this way, the current was continued to be supplied until the voltage reached 150 V, whereupon the voltage was maintained constant. Then, the supply of the current is continued until the current reached 0.1 mA. The constant current persisted for about 50 minutes. The constant voltage persisted for about 2 hours. In this way, an aluminum oxide film 111 having a thickness of 0.3 to 0.5 μm could be formed on the surfaces of the gate electrode and interconnects. The formed aluminum oxide film itself was sufficiently dense. To increase the insulation, the film was retained in hot water for 10 minutes. A coating having a high resistance to voltage of 6–12 MV/cm was formed by this step.

Subsequently, ions of boron or a boron compound such as $BF_2^+$ were implanted by a well-known ion implantation method, using the gate electrode 109 as a mask. In this way, a p-type doped region 112 was formed. The wafer was thermally annealed to recrystallize the doped region.

Thereafter, the substrate was immersed in a solution of hydrofluoric acid, e.g., 1/10 hydrofluoric acid, to etch (remove) a portion of the gate oxide film 105 of silicon oxide, thus exposing the surface of the semiconductor region 112. At this time, aluminum oxide was insoluble to hydrofluoric acid and so those portions of the silicon oxide film which were located under the gate electrode and interconnects were left behind. A portion of the silicon oxide film under the gate electrode is left as a gate insulating film. A portion of the semiconductor film 104 is then unexposed under the gate electrode and the aluminum oxide film 111. However, it must be noted that if the laminate is placed in hydrofluoric acid for a long time, even those portions of the silicon oxide film which are located under the gate electrode and interconnects will be dissolved away.

Finally, holes 113 extending through the doped region 112 of the second transistor and to the doped region 101 of the first transistor were formed at the exposed portions 112. Electrodes and interconnects (wirings) 114 connecting the exposed portions 112 with terminals (source and drain terminals) of the first MOS transistor through the holes were fabricated from a metal such as aluminum or chromium. Thus, the integrated circuit was completed.

Figure 2A:
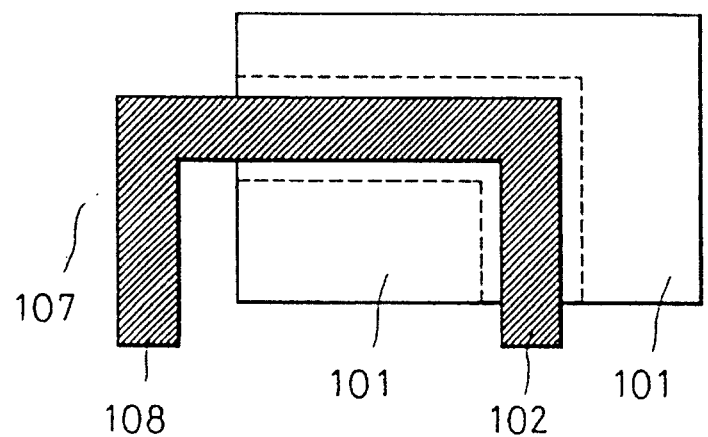
FIG. 2, (A) and (B), are plan views of the multilayer integrated circuit shown in FIG. 1, (A)–(D)
Figure 2B:
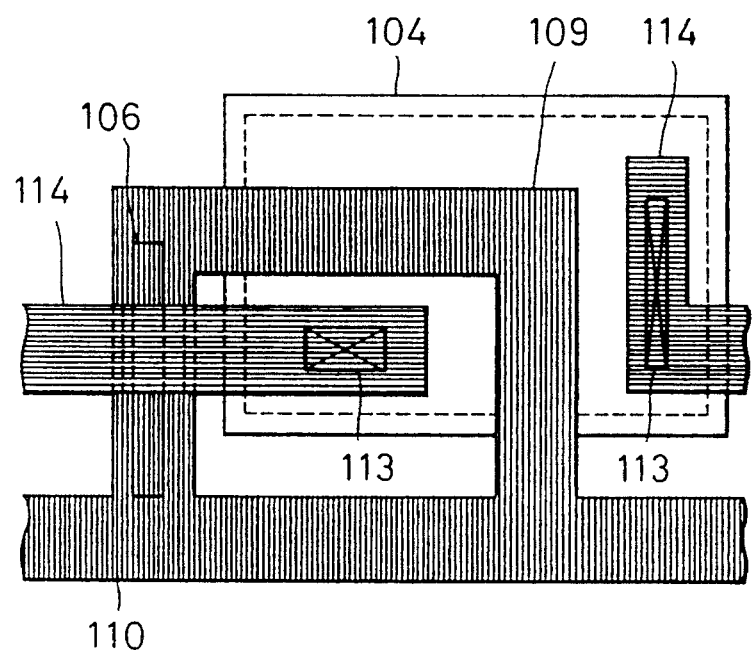

FIG. 2, (A) and (B), are top views of the multilayer CMOS circuit fabricated by the steps of FIG. 1, (A)–(D). FIG. 2(A) shows the manner in which the first transistor has been completed. FIG. 2(B) shows the manner in which the second transistor was formed on the first transistor, and conductive interconnects between the transistors were completed.

In this manner, the present invention makes it possible to form upper interconnects directly on the second transistor without forming interlayer insulator, because the lower interconnects have been already coated with the oxide film. Consequently, in this stage, the number of masks can be reduced by one compared with the prior art process.

However, this method sometimes presents substantial problems. In the structure of FIG. 1, (A)–(D), the interlayer insulator was only the oxide film which covers the lower interconnects. In this case, the thickness presents a problem. Furthermore, such an oxide has a large dielectric constant, increasing the capacitance between conductive interconnects. Accordingly, an anodic oxidized film may be used. Also, an interlayer insulator may be formed on this anodic oxidized film to increase the thickness. Moreover, the average dielectric constant is decreased, thus reducing the capacitance between the interconnects. Specifically, the oxide formed by anodic oxidation is dense and resistant to high voltages. Hence, this oxide film is well suited for insulative isolation between the layers. In the past, only one insulating layer have existed between successive layers. Therefore, the voltage-resistance is not satisfactory. Especially, at junctions of conductive interconnects, there exist steps. The interlayer insulator cannot fully cover these steps, permitting presence of defects such as cracks. As a result, short circuit to the upper interconnects often occurs. In accordance with the present invention, it is by no means necessary to consider such defects due to the steps. In consequence, the production yield is enhanced greatly. The number of the masks necessary to fabricate the circuit by the novel method is the same as used in the prior art techniques. Where the doped region of the second transistor is extremely thin, the invention cannot be adequately embodied. Where the thickness is in excess of 50 nm, the integrated circuit can be mass-produced without decreasing the production yield in the step of the electrode formation. This circuit is especially suited for high-voltage applications.

A multilayer integrated circuit could be fabricated with a less number of masks than conventional in accordance with the present invention. Also, a more reliable multilayer integrated circuit could be manufactured with the same number of masks as used in the prior art techniques in accordance with the present invention. One objective of the invention is to enhance the production yield of multilayer integrated circuits. Especially, the formation of the source and drain electrodes of thin-film transistors of a multilayer integrated circuit requires high accuracy, because each electrode has a width less than 1 μm and a thickness less than 10 nm. This step has given rise to much more defects than other steps. The present invention dispenses with formation of holes in electrodes connected with thin-film transistors. Hence, the production yield is improved greatly.

In multilayer interconnection integrated circuits, defects due to short circuit between the gate interconnects and the signal lines such as source and drain interconnects have presented serious problems. These problems arise directly from problems with handling. Also, we consider that faults in the interlayer insulator induce these problems. In particular, silicon oxide forming the interlayer insulator cannot fully cover the undulations of conductive interconnects. As a result, the thickness is not uniform. Especially, the film is thin on the side surfaces of the gate interconnects which are lower conductive interconnects. On the other hand, the film is sufficiently thick on the upper surfaces of the lower interconnects. Under this condition, if upper interconnects are formed, short circuit tends to occur on the side surfaces of the lower interconnects. In accordance with the present invention, the thickness of the anodic oxidized insulating film on the side surfaces of the lower interconnects hardly differs from the thickness of the insulating film on the upper surfaces of the lower interconnects. In consequence, the problem of nonuniform thickness is solved. If the conventional interlayer insulating film is formed after the formation of the anodic oxidized insulating film, then the insulating property can be improved further.

Multilayer integrated circuits to which the invention is applied are not restricted to CMOS circuits. The present invention can be applied with equal utility to integrated circuits consisting only of NMOS circuits and also to integrated circuits consisting only of PMOS circuits. In the above description, an NMOS and a PMOS are taken as the first and second transistors, respectively, for ease of illustration. Obviously, the reverse combination can be adopted without departing from the scope of the invention.

In the above EXAMPLE, aluminum of the gate electrode of the second MOS transistor may be replaced by a multi-layer of a phosphorus doped silicon layer and an aluminum layer provided on the silicon layer, a multi-layer of a phosphorus doped silicon layer and a layer comprising metal or metal silicide, a multi-layer of an aluminum film and a tantalum film provided on the aluminum film, or a single layer comprising a material selected from the group consisting of aluminum, tantalum, titanium, aluminum silicide, tantalum silicide and titanium silicide. Thickness of the phosphorus doped silicon layer is preferably 20 to 300 Å.

What is claimed is:

1. A method for forming a semiconductor device comprising the steps of:
   forming a first MOS transistor of one conductivity type on a semiconductor substrate;
   forming an insulating film on said first MOS transistor;
   selectively forming a semiconductor film on said insulating film;
   forming an opening in said insulating film;
   forming a gate electrode on said semiconductor film;
   oxidizing a material of said gate electrode;
   introducing an impurity into said semiconductor film to form a doped region therein; and
   forming an electrode connecting said doped region with one of source and drain of said first MOS transistor,
   wherein said electrode is in contact with top and side surfaces of said doped region.

2. The method of claim 1 wherein said a gate electrode comprises a multi-layer of a silicon film and an aluminum film provided on said silicon film.

3. The method of claim 1 wherein said a gate electrode comprises a multi-layer of an aluminum film and a tantalum film provided on said aluminum film.

4. The method of claim 1 wherein said a gate electrode comprises a single layer comprising a material selected from the group consisting of aluminum, tantalum, titanium, aluminum silicide, tantalum silicide and titanium silicide.

5. A method for forming a semiconductor device comprising:
   a first MOS transistor of one conductivity type provided on a semiconductor substrate; and
   a second MOS transistor of a conductivity type different from said one conductivity type provided on said first MOS transistor with an insulating film therebetween, said second MOS transistor comprising a gate electrode and an oxide layer covering a surface of said gate electrode,
   said method comprising the steps of:
   forming a semiconductor layer on said insulating film;
   forming a gate insulating film on said semiconductor layer;
   introducing an impurity into said semiconductor layer to form a doped region therein;
   removing a portion of said gate insulating film to expose a portion of said doped region of said semiconductor layer with a portion of said semiconductor layer being unexposed under said gate electrode and said oxide layer;
   forming a hole in the exposed portion; and
   forming an electrode and a wiring connecting the exposed portion of said doped region with a terminal of said first MOS transistor through said hole,
   wherein said electrode and said wiring are in contact with top and side surfaces of said doped region.

6. The method of claim 5 wherein a source or a drain of said second MOS transistor is provided in said exposed portion and is connected with said terminal through said hole.

7. The method of claim 5 wherein said terminal is a source or a drain terminal of said first MOS transistor.

8. The method of claim 5 wherein said gate electrode comprises a single layer comprising a material selected from the group consisting of aluminum, tantalum, titanium, aluminum silicide, tantalum silicide and titanium silicide.

9. The method of claim 5 wherein said gate electrode comprises a multi-layer of a silicon film and an aluminum film provided on said silicon film.

10. The method of claim 5 wherein said gate electrode comprises a multi-layer of an aluminum film and a tantalum film provided on said aluminum film.

11. A method for forming a semiconductor device comprising the steps of:
    forming a first MOS transistor of one conductivity type on a semiconductor substrate;
    forming an insulating film on said first MOS transistor;
    selectively forming a semiconductor film on said insulating film;
    forming an opening in said insulating film;
    forming a gate electrode on said semiconductor film;
    oxidizing a material of said gate electrode to form an oxidized surface of said gate electrode;
    introducing an impurity into said semiconductor film to form a doped region therein; and
    forming an electrode connecting said doped region with one of source and drain of said first MOS transistor,
    wherein said electrode is in contact with top and side surfaces of said doped region, and
    wherein said electrode crosses said gate electrode over the oxidized surface of said gate electrode.

* * * * *